(12) United States Patent
Kida et al.

(10) Patent No.: US 6,313,540 B1
(45) Date of Patent: Nov. 6, 2001

(54) ELECTRODE STRUCTURE OF SEMICONDUCTOR ELEMENT

(75) Inventors: Tsuyoshi Kida; Kenji Oyachi, both of Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/469,761

(22) Filed: Dec. 22, 1999

(30) Foreign Application Priority Data

Dec. 25, 1998 (JP) .................................................. 10-371081

(51) Int. Cl.$^7$ ...................................................... H01L 23/29
(52) U.S. Cl. .............................................. 257/784; 257/786
(58) Field of Search ..................................... 257/786, 780, 257/781, 784, 773

(56) References Cited

U.S. PATENT DOCUMENTS

| | | | |
|---|---|---|---|
| 5,736,791 | * | 4/1998 | Fujki et al. . |
| 5,739,587 | * | 4/1998 | Sato . |
| 5,923,088 | * | 7/1999 | Shiue et al. . |
| 6,100,589 | * | 8/2000 | Tanaka . |
| 6,181,016 | * | 1/2001 | Lin et al. . |

FOREIGN PATENT DOCUMENTS

| | | |
|---|---|---|
| 5-343466 | 12/1993 | (JP) . |
| 8-17859 | 1/1996 | (JP) . |
| 8-293523 | 11/1996 | (JP) . |
| 11-126776 | 5/1999 | (JP) . |
| 2000-195866 | 7/2000 | (JP) . |

* cited by examiner

Primary Examiner—Sheila V. Clark

(57) ABSTRACT

An electrode structure of a semiconductor element comprises a wiring 14 formed on one main surface of a semiconductor chip, an insulating film 15 formed on the wiring 14, at least one pad 3 located at a predetermined position on the insulating film 15 and a via-hole 16 formed in the insulating film 15. The via-hole 16 is filled with a metal material for electrically connecting the wiring 14 to the pad 3 and a contact area between the via-hole 16 and the pad 3 is 3% or more of a surface area of the pad 3 on the side of the via-hole 16. With such structure, it becomes possible to restrict occurrence of breakage and/or crack of the insulating film 15 during a time when a bonding wire 18 is connected to the pad 3 to thereby improve the fabrication yield.

3 Claims, 11 Drawing Sheets

ELECTRODE STRUCTURE OF SEMICONDUCTOR ELEMENT

CROSS REFERENCE TO RELATED APPLICATIONS

The present invention claims priority from Japanese Patent Application No. 10-371081 filed Dec. 25, 1998, the contents of which are incorporated herein by reference.

BACKGROUND OF THE INVENTION

1. Field of the Invention

The present invention relates to an electrode structure of a semiconductor element and, particularly, to an electrode structure suitable for a high density integration of semiconductor elements on a semiconductor chip.

2. Description of Related Art

In order to respond to recent requests of grade-up of electronic equipments, reduction of size and weight thereof and increase of an operation speed thereof, semiconductor devices based on new concepts are having been developed. For example, a reduction of size and weight of an electronic equipment has been realized by reducing size and thickness of semiconductor devices integrated on a semiconductor chip at high density.

FIG. 1 is a plan view of a semiconductor element formed on a chip and constituting a semiconductor device and FIG. 2 shows a portion of the semiconductor element in enlarged scale. The semiconductor element 1 includes an internal circuit 2 and pads 3 for electrodes, arranged in a peripheral portion of the internal circuit 2. The semiconductor element 1 is connected externally by connecting the pads 3 to external lead terminals of a package through bonding wires. The bonding wires are connected to the pads 3 by pressing the bonding wires to the pads 3 while applying heat and ultrasonic vibration to the connecting points therebetween. Such connection method is referred to as "wire bonding".

In a recent semiconductor element, particularly, a semiconductor element for logic operation, the number of signal lines, which can not be used commonly, is increased with increase of integration density for improving performance thereof. Therefore, it is necessary to arrange a number of pads in an outer peripheral portion of the semiconductor element, for exchange of signals between an internal portion of the semiconductor element and an outside thereof. Further, in order to stabilize an operation of the semiconductor element, it is necessary to increase the number of not only pads for power sources but also those for grounding.

On the other hand, the size and weight of a whole semiconductor device constructed by integrating a plurality of such semiconductor elements on a single chip is also being reduced. In such case, since the reduction of size and weight of the semiconductor device itself is reduced with increase of integration density of the internal circuits of the semiconductor elements and an area of each semiconductor element, which is required for arranging an increased number of pads, is limited, it is necessary in order to increase the number of pads to reduce a pitch (P in FIG. 2) between adjacent pads.

Further, the size of a transistor, which is a minimum unit of a semiconductor device, is being reduced in concomitance with improvement of performance of a fabrication apparatus for fabricating the semiconductor device and improvement of a fabrication process thereof and, therefore, the size of an internal circuit of each of semiconductor elements constituting the semiconductor device is also being reduced. As a result, the size of the whole semiconductor element is reduced and, so, the size of each of the pads to be arranged in the semiconductor element has to be reduced.

Under the circumstances, the area of each pad defined by X and Y and the pitch P are reduced from X=Y=80 $\mu$m and P=100 $\mu$m to X=Y=60 $\mu$m and P=80 $\mu$m, respectively, as shown in FIG. 2.

FIGS. 3 and 4 are cross sections showing examples of a conventional structure of a peripheral portion of a pad of a semiconductor element, respectively. In these examples an oxide film 12 of such as $SiO_2$ is formed on a semiconductor substrate of such as Si and an insulating film 13 of such as $SiO_2$ or SiOF is formed on the oxide film 12. Further, a wiring 14 of such as Cu is formed on the insulating film 13. An insulating film 15 is formed on the wiring 14 and pads 3 of such as Al are formed on the insulating film 15. A via-hole 16 is formed in the insulating film 15. The via-hole 16 is filled with a metal such as W, Al or Cu to electrically connect the wiring 14 to the pad 3. In the example shown in FIG. 3, the via-hole 16 is formed such that the via-hole 16 is located in substantially a center of the pad 3 and, in the example shown in FIG. 4, the via-hole 16 is located in the vicinity of an end portion of the pad 3. There may be a case where a plurality of via-holes are provided for each pad. A periphery of the pad 3 are protected by a metal film of such as TiN or Ti covering it and other area of the semiconductor element than the pad area is usually protected by an insulating film 17 of such as $SiO_2$ covering it. The pad 3 is electrically connected to an external lead terminal of a package through a wire 18.

The connection between the pad 3 and the wire 18 is performed by thermosonic wire bonding, which connects metal materials by pressing one of them to the other while using pressure, heat and ultrasonic vibration simultaneously. That is, a top end of a gold or copper wire supplied through a capillary is balled by heating it by an electrictorch and the ball is pressed and connected to the pad while applying ultrasonic wave thereto.

In the electrode structures shown in FIGS. 3 and 4, however, the fabrication yield of semiconductor device is reduced due to thermosonic wire bonding, that is, the producibility of semiconductor device becomes degraded.

That is, when the wire is mechanically pressed to the pad in order to perform the thermosonic wire bonding, there is a possibility that the pressing force is propagated to a connecting portion between the pad and the underlying insulating film and the connecting portion is damaged thereby. Such phenomenon does not cause substantial problem if the size of the pad is relatively large and the pitch of the pads is relatively large. However, when the size and pitch of the pads are reduced with reduction of the size of semiconductor element and increase of the integration density, the size of the ball formed on the top of the wire must be reduced. Therefore, stress exerted on a unit area of the pad is increased, so that breakage and damage of the pad and the underlying insulating film tend to occur. This problem may cause the pad to be easily peeled off, resulting in reduction of fabrication yield of semiconductor device, that is, degradation of the producibility.

SUMMARY OF THE INVENTION

The present invention was made in view of the problems of the conventional techniques and has an object to provide a reliable electrode structure of a semiconductor element useful in fabricating a semiconductor device with high yield.

In order to achieve this object, according to the present invention, an electrode structure of a semiconductor element is provided, which comprises pads provided in predetermined positions on an insulating film, which is formed on a wiring formed on one main surface of a semiconductor chip and has via-holes filled with a metal for connecting the wiring to the pads. A total contact area of the via-hole with the pad is 3% or more of a surface area of the pad on the side thereof in contact with the via-hole. With this electrode structure, a region between the wiring and the pad is reinforced, so that it is possible to restrict breakage or crack of the insulating film underlying the pad when a bonding wire is connected to the pad to thereby prevent the pad from being peeled off. Therefore, it is possible to improve the reliability of a connecting portion between the pad and the insulating film to thereby improve the fabrication yield of semiconductor device.

In the present invention, it is possible to provide a plurality of via-holes for each pad. Particularly, it is preferable to provide 70,000 via-holes or more in a surface area of pad of 1 mm$^2$. With the provision of a plurality of via-holes for each pad, even when a portion of the via-holes is damaged during the bonding wire is connected to the pad, the connection between the wiring and the pad can be kept by remaining via-holes, which are not damaged.

BRIEF DESCRIPTION OF THE DRAWINGS

Embodiments of the present invention will be described with the accompanying drawings, in which.

DETAILED DESCRIPTION OF THE PREFERRED EMBODIMENTS

Figure 5:
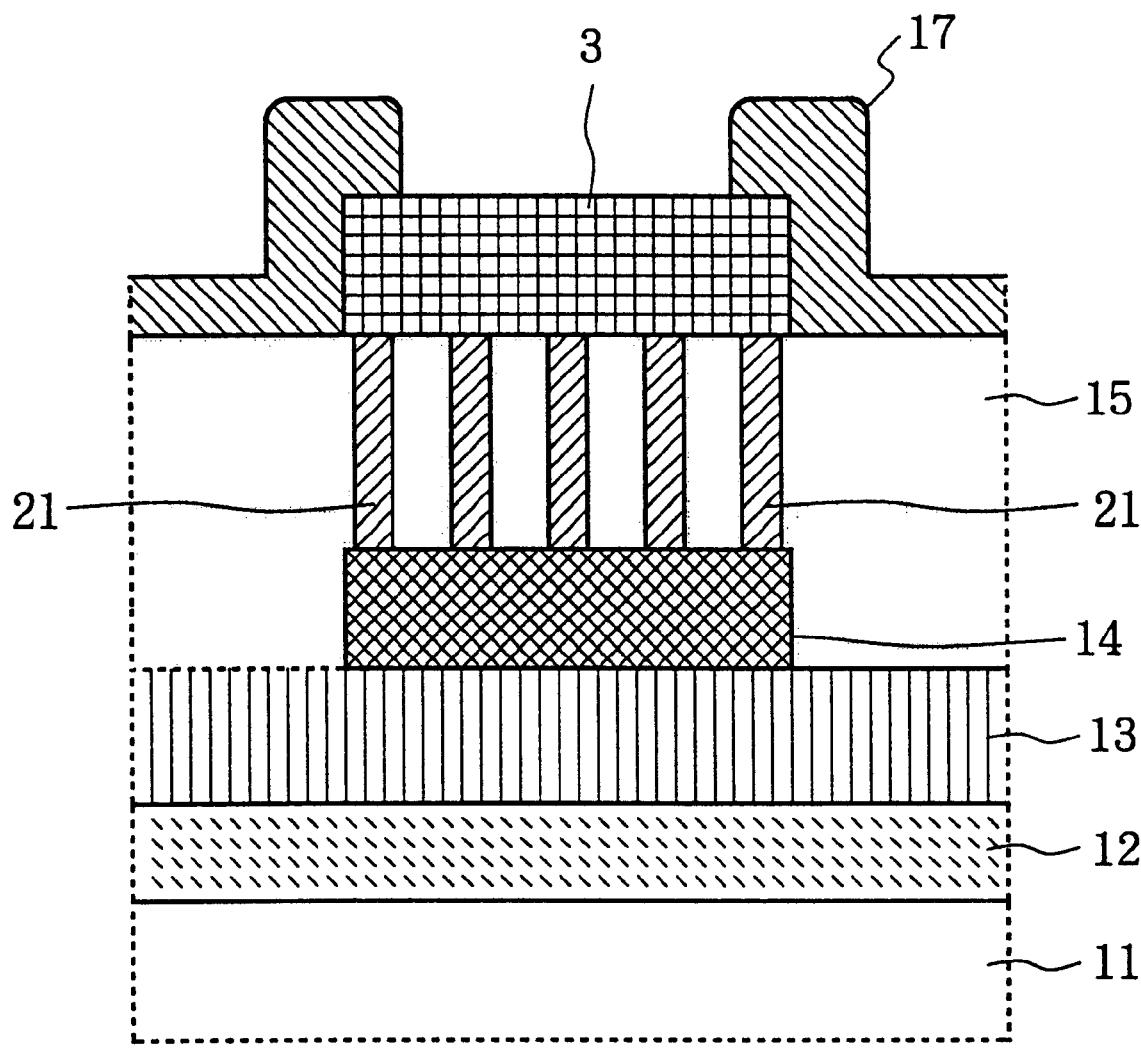
FIG. 5 is a cross section of an electrode structure according to an embodiment of the present invention.

In FIG. 5 showing an embodiment of the present invention, an oxide film 12 of such as SiO$_2$ is formed on a semiconductor substrate 11 of such as Si and an insulating film 13 of such as SiO$_2$ or SiOF is formed on the oxide film 12. Further, a wiring 14 of such as Cu is formed on the insulating film 13. An insulating film 15 is formed on the wiring 14 and pads 3 of such as Al are provided on the insulating film 15. A plurality of via-holes 21 are forming in the insulating film 15 and filled with a metal material such as W, Al or Cu to electrically connect the wiring 14 to the pads 3. Among them, W having high hardness is particularly preferable as the metal material filling the via-holes 21. A periphery of each of the pads 3 is protected by a metal coating of such as TiN or Ti and other surface area of the semiconductor element than the peripheries of the pads 3 is covered by an insulating film 8 of such as SiO$_2$. The pads 3 are electrically connected to respective external lead terminals of the package through wires. Each of the pads 3 may have one or more of the via holes 21 contacting them. A contact area of the at least one via-hole contacting a particular pad 3 and the particular pad is 3% or more of a surface area of the particular pad 3 on the side thereof in contact with the at least one via-hole 21.

Figure 6A:
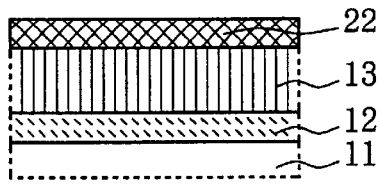
FIGS. 6a to 6j show fabrication steps of the electrode structure shown in FIG. 5.
Figure 6B:
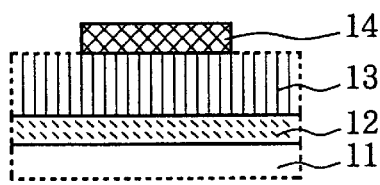
Figure 6C:
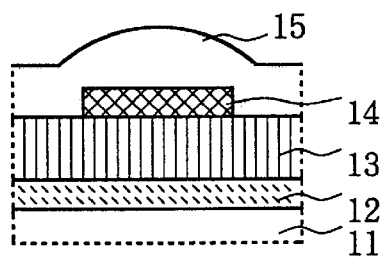
Figure 6D:
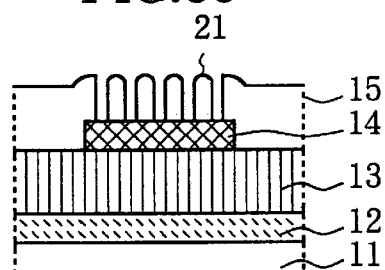
Figure 6E:
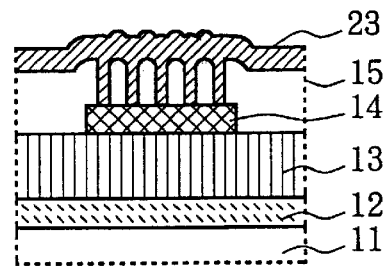
Figure 6F:
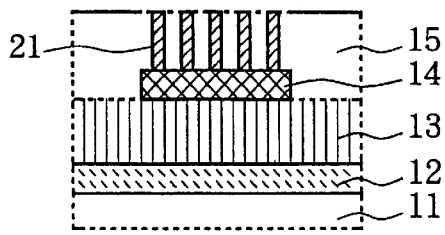
Figure 6G:
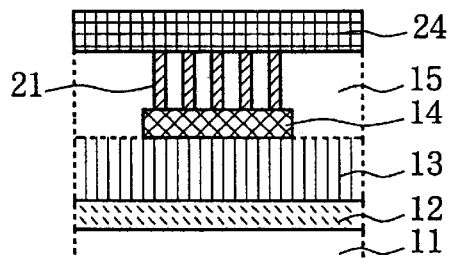
Figure 6H:
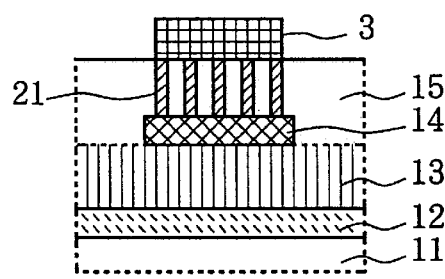
Figure 6I:
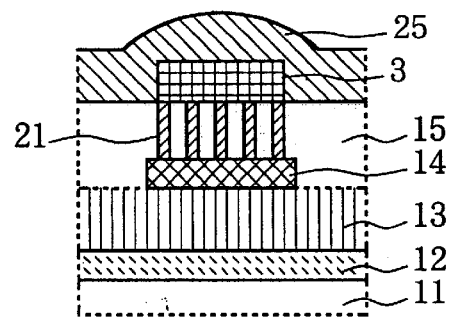
Figure 6J:
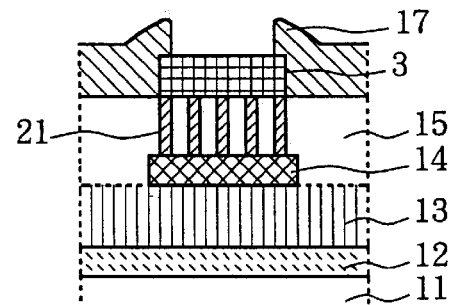

Now, a fabrication method of the embodiment shown in FIG. 5 will be described with reference to FIGS. 6a to 6j. First, as shown in FIG. 6a, a wiring material film. 22 is formed on the lamination of the insulating film 13 and the oxide film 12, which is formed on the semiconductor substrate 11. The wiring material film 22 is usually of Cu. However, a lamination of TiN, Al, TiN and Ti, etc., may be used as the wiring material film 22. Next, as shown in FIG. 6b, the wiring 14 is formed by patterning the wiring material film 22 by etching. The etching pattern is usually provided by photolithography. Subsequently, the insulating film 15 is formed on the insulating film 13 and the wiring 14 as shown in FIG. 6c and the via-holes 21 are formed by etching the insulating film 15 as shown in FIG. 6d. Further, a metal layer 23 of such as W, Al or Cu is deposited on the wafer to fill the via-holes 21 therewith, as shown in FIG. 6e. A thin film of such as TiN, etc., may be formed on wall surfaces of the via-holes 21 before the via-holes 21 are filled with the metal. Then, as shown in FIG. 6f, the metal layer 23 except portions thereof filling the via-holes 21 is removed from the insulating film 15 and a surface of the insulating film 15 and surfaces of opening portions of the via-holes 21 are flattened. Thereafter, as shown in FIG. 6g, a metal layer 24 is formed on the insulating film 15 and the via-holes 21 and, then, the pads 3 having a predetermined shape are formed by etching the metal layer 24 as shown in FIG. 6h. Further, as shown in FIG. 6i, an insulating film 25 of such as SiO$_2$ is deposited on the pads 3 and the insulating film 15 and an insulating film 17 is formed by etching the insulating film 25 as shown in FIG. 6j.

In the present invention, the contact area of the at least one via-hole contacting a particular pad 3 and the particular pad is 3% or more of a surface area of the particular pad 3 on the side thereof in contact with the at least one via-hole 21, as mentioned previously. Preferably, however, the contact area of the at least one via-hole and the particular pad contacting the at least one via-hole is 5% or more of the surface area of the particular pad 3 on the side thereof in contact with the at least one via-hole 21 and, more preferably, it is 10% or more.

Since, in the conventional electrode structure, the purpose of the via-holes is to merely electrically connect the pad to the wiring, only one or several via-holes are provided for every pad and a cross sectional area of the one or several via-holes is small enough to provide an electric connection. Contrary to the conventional electrode structure, a cross sectional area of the at least one via-hole and hence the contact area of the at least one via-hole and the pad in the present invention is substantially larger than that necessary for electric connection between the at least one via-hole and the pad. Therefore, it is possible to disperse stress during the bonding operation to thereby prevent breakage and/or crack of the insulating film underlying the pad from occurring.

Figure 7A:
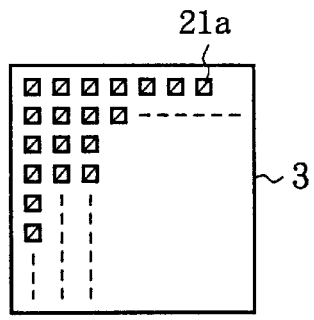
FIGS. 7a to 7h show examples of a contact surface configuration of a via-hole and a pad.
Figure 7E:
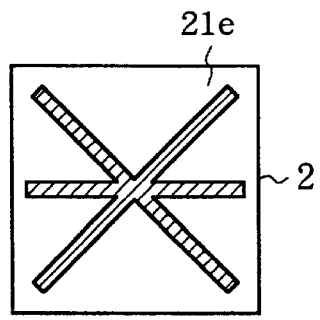

FIG. 7a shows an example of the shape and arrangement of the contact surfaces between the opening portions 21a of the via-holes 21 and the pad 3 shown in FIG. 5. In this example, a plurality of via-holes are provided in rows and columns with constant interval for one pad and the shape of the opening portion 21a is square having each side of 0.6 $\mu$m. However, the shape of the opening portion 21a is not always square and may have other shape such as circular shape.

Figure 7B:
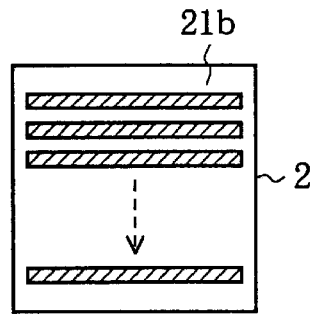
Figure 7F:
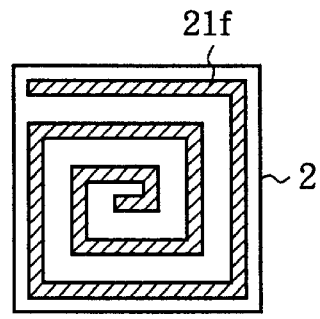
Figure 7C:
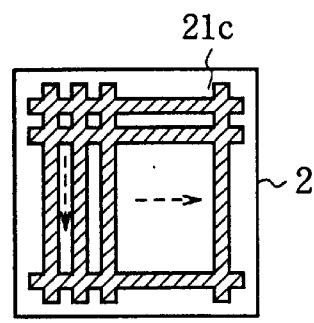
Figure 7G:
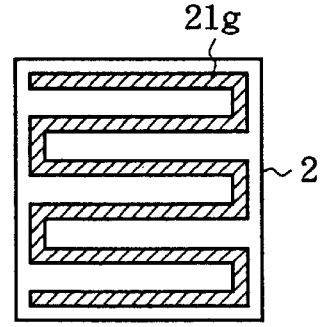
Figure 7D:
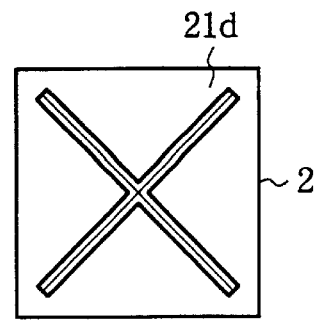
Figure 7H:
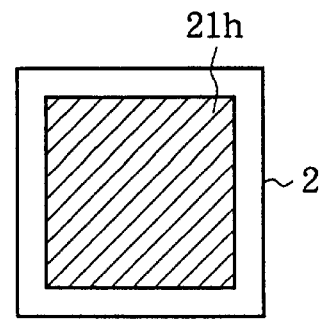

Modifications of the shape of the opening portion of the via-hole(s) and the arrangement thereof are shown in FIGS. 7b to 7h. FIG. 7b shows an example in which rectangular opening portions 21b are arranged in parallel and FIGS. 7c to 7h show examples in each of which one opening portion is provided for each via-hole and the opening portions 21c to 21h have different shapes.

In a case where a plurality of via-holes are provided for each pad, it is preferable to provide 70,000 via-holes or more in 1 mm$^2$ of a surface area of a pad. More preferably, 150,000 via-holes or more, particularly, 600,000 via-holes or more are provided for each pad. With the provision of a plurality of via-holes for each pad, it is possible to minimize the occurrence of breakage and/or crack of the insulating film underlying the pads during the bonding wires are connected to the pads and even when a portion of the via-holes is damaged during the bonding wire is connected to the pad, and to prevent the pads from being peeled off.

Figure 8:
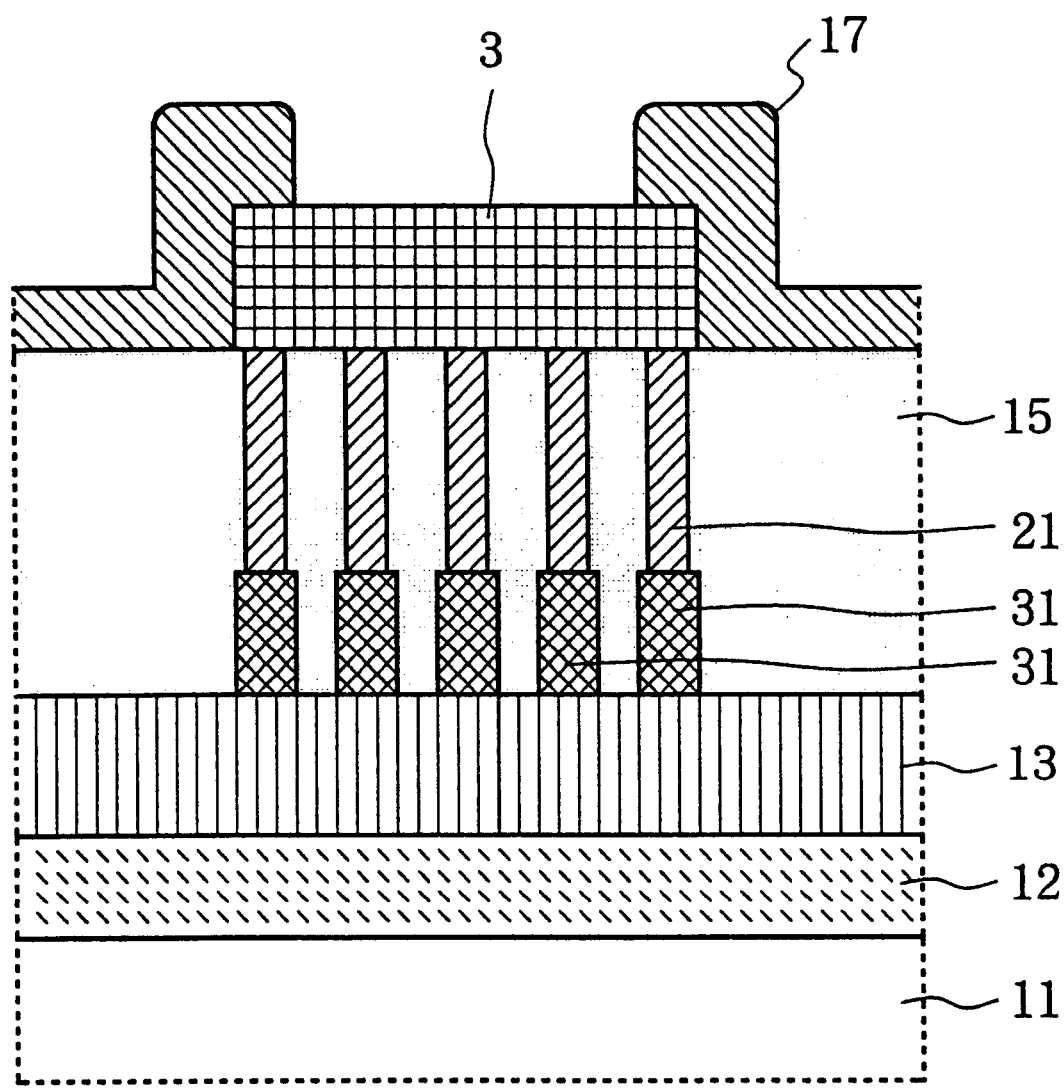
FIG. 8 is a cross section of a modification of the electrode structure shown in FIG. 5.

Although, in the above description, the connection between the wiring 14 and one pad 3 has been described mainly, it is possible to provide a plurality of wiring 31 for each pad 3 and to provide one or a plurality of via-holes 21 for each wiring, as shown in FIG. 8.

Figure 9:
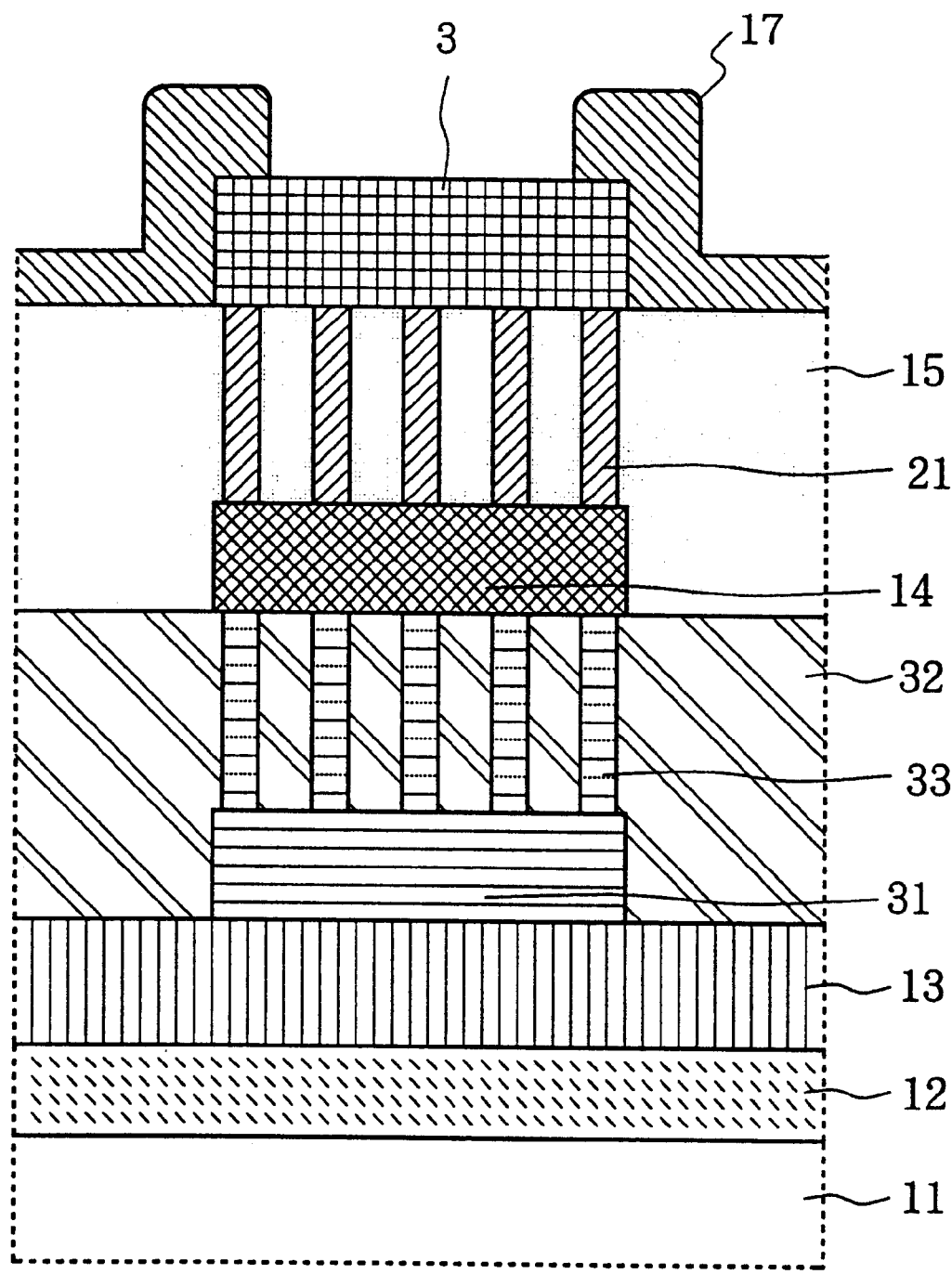
FIG. 9 is a cross section of another modification of the electrode structure shown in FIG. 5.

Further, it is possible to utilize the present invention in a structure for connecting two wiring layers as shown in FIG. 9. That is, a wiring 31 and an insulating film 32 are provided between the insulating film 13 and the wiring 14 of the structure shown in FIG. 5 and via-holes 33 are provided in the insulating film 32 for connecting the wiring 14 and the wiring 31.

Figure 1:
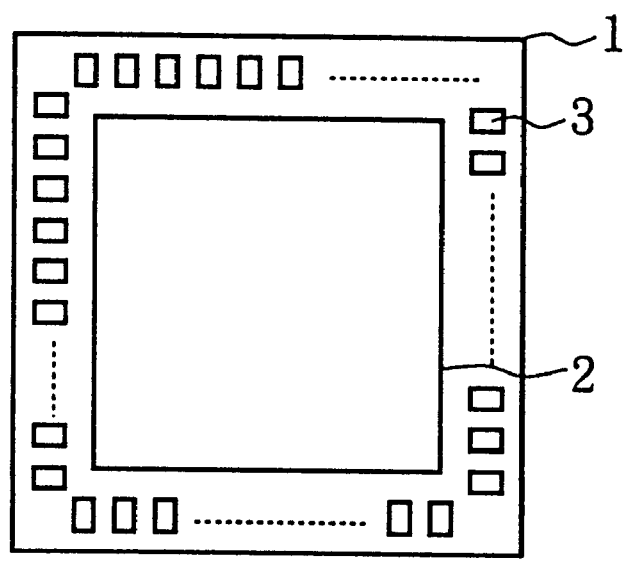
FIG. 1 is a plan view of a semiconductor element constituting a semiconductor device formed on a chip.
Figure 2:
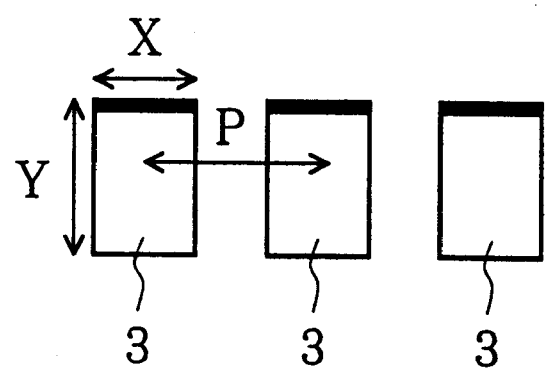
FIG. 2 is an enlarged view of a portion of the semiconductor element shown in FIG. 1.
Figure 3:
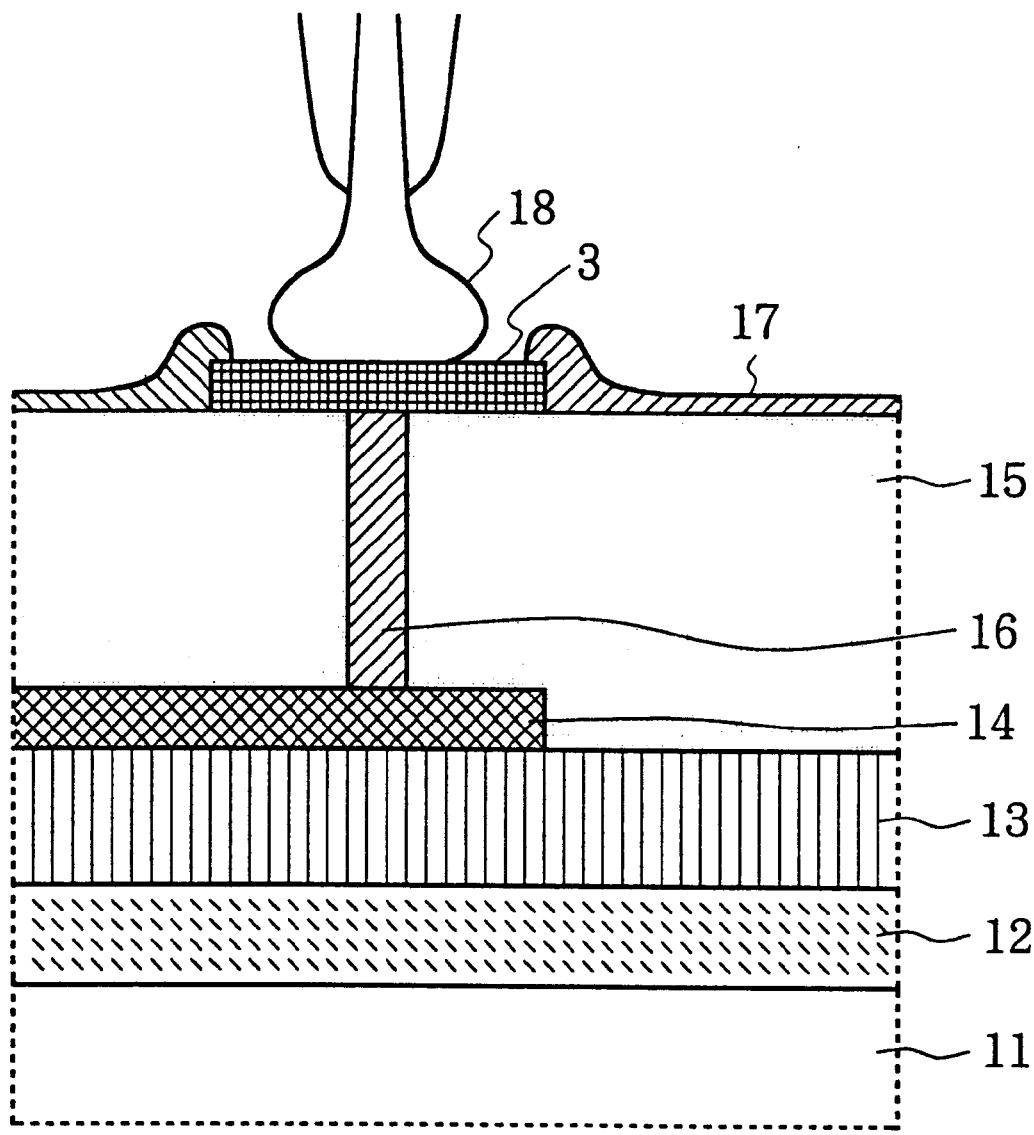
FIG. 3 is a cross section of an example of a conventional electrode structure.
Figure 4:
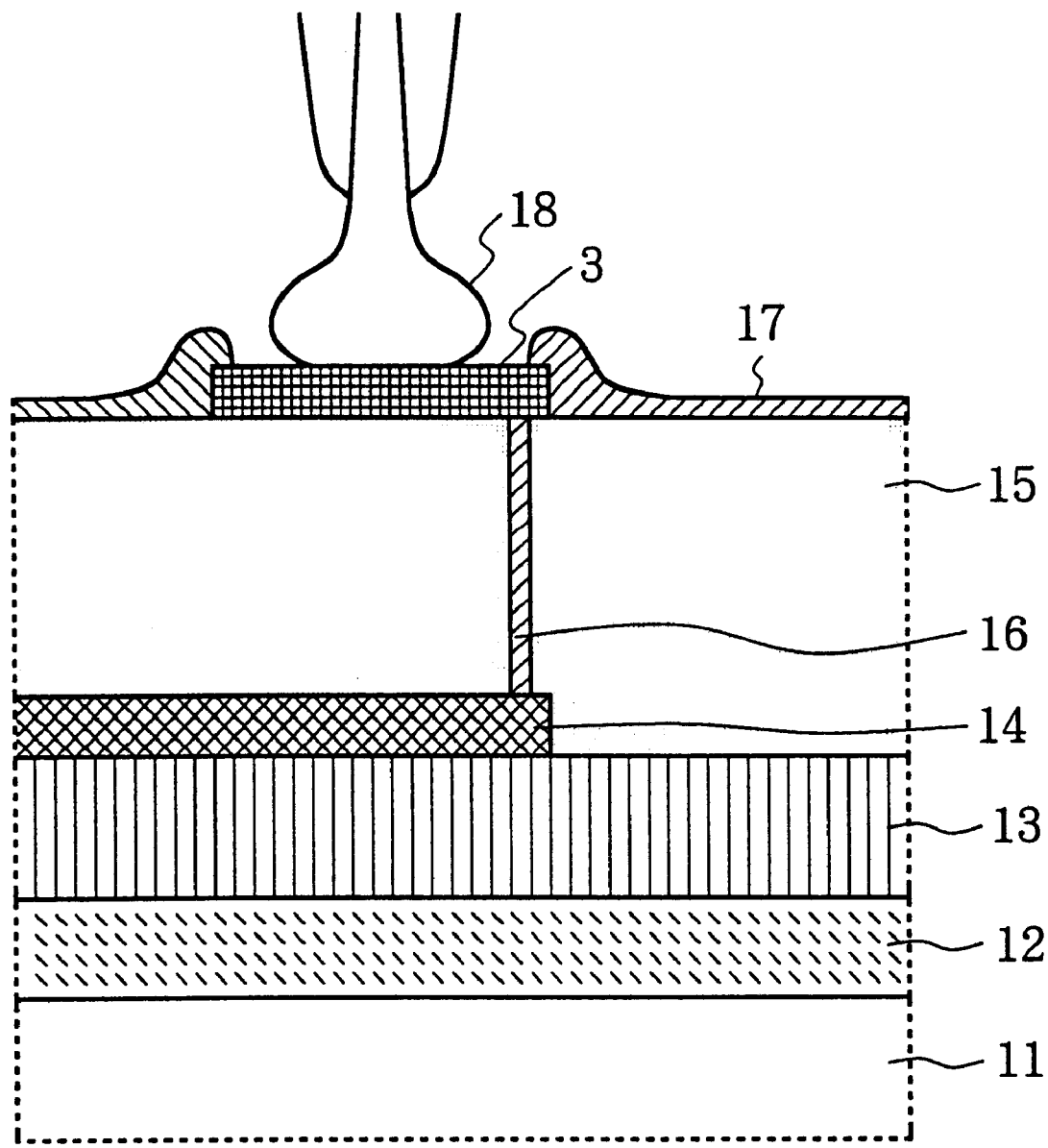
FIG. 4 is a cross section of another example of a conventional electrode structure.
Figure 10:
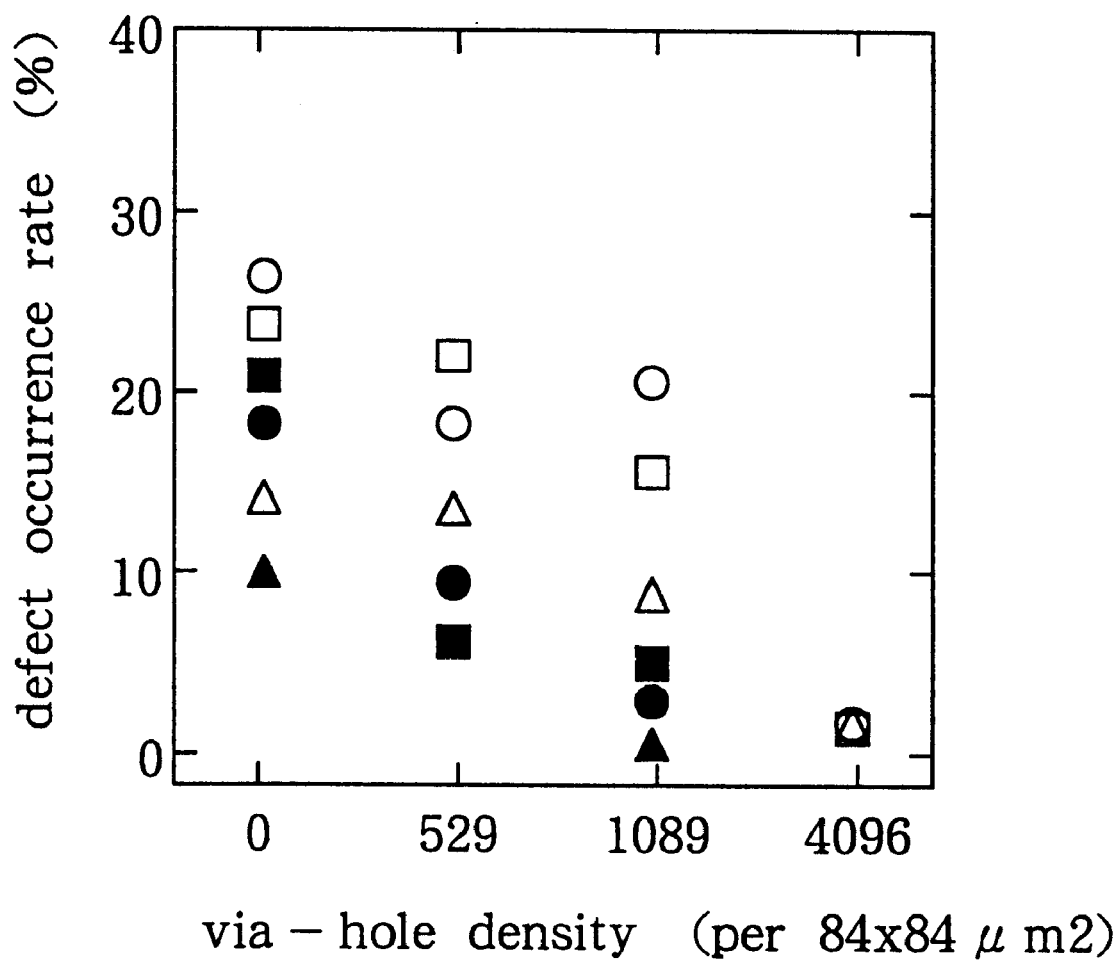
FIG. 10 shows a relation between density of via-hole and generation rate (%) of defect such as breakage or crack of the connecting portion of the pad and the second insulating film of the semiconductor device shown in FIGS. 2 and 5.
Figure 11:
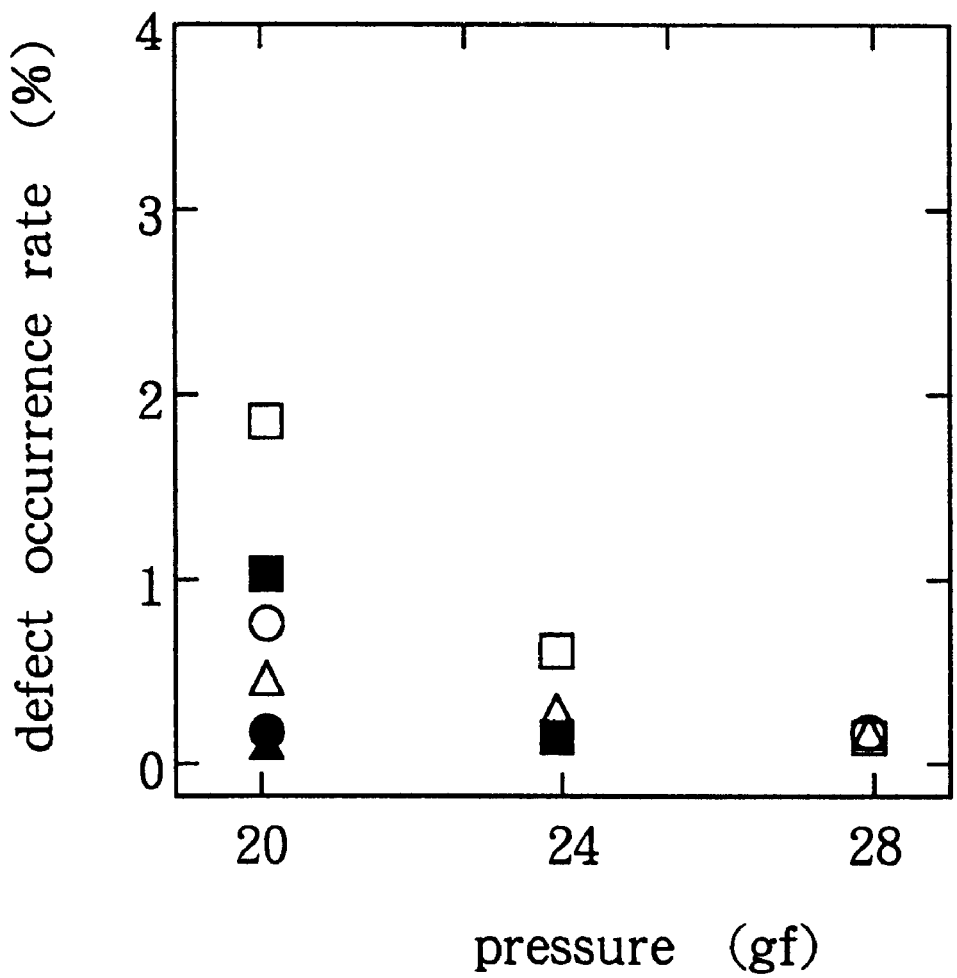
FIG. 11 shows a relation between pressure exerted at the time of bonding and generation rate (%) of defect such as breakage or crack of the connecting portion of the pad and the second insulating film of the semiconductor device shown in FIGS. 2 and 5.

Defect occurrence rates of the electrode structure of the present invention and the conventional electrode structure when the bonding wires are bonded to the pads by thermosonic bonding were investigated. FIGS. 10 and 11 show results of the investigation performed for the embodiments shown in FIGS. 5 and 8 and FIG. 12 shows a result of the investigation performed for the conventional structure shown in FIGS. 3 and 4.

FIG. 10 shows a relation between the via-hole density and the defect occurrence rate for the electrode structures shown in FIGS. 5 and 8. In this investigation, the defect occurrence rate (%) of such as breakage and/or crack of the connecting portion between the pad of Al and the insulating film underlying the pad when the bonding wires were bonded to the pads by thermosonic bonding under pressure of 24gf while changing the thickness of pad from 4500Å through 6200Å to 7000Å. The pad was 84 $\mu$m×84 $\mu$m square and the contact area of the via-hole with the pad was 0.6 $\mu$m×0.6 $\mu$m square. Same test was repeated for samples having via-holes per pad of 0, 529, 1089 and 4096.

As shown in FIG. 10, the defect occurrence rate of the samples having via-holes is high compared with the samples having no via-hole, that is, having 0 via-hole density, and is reduced with increase of the via-hole density. Further, it is confirmed that the defect occurrence rate of the electrode structure shown in FIG. 5 is reduced when the via-hole density is 529/84×84 $\mu$m$^2$, that is, the number of via-holes in1mm$^2$ area of the pad on the side of the via-hole is about 75,000/mm$^2$. In this case, it can be said from the total area of the via-holes and the number of the via-holes that the via-holesis in contact with about 3% of the surface of the pad. Particularly, when the via-hole density is 4096/84×84 $\mu$m$^2$, that is, about 600,000/mm$^2$, the defect occurrence rate in the connecting portion is substantially reduced. In such case, it can be said from the total area of the via-holes and the number of the via-holes that the via-holes is in contact with about 21% of the surface of the pad.

Figure 12:
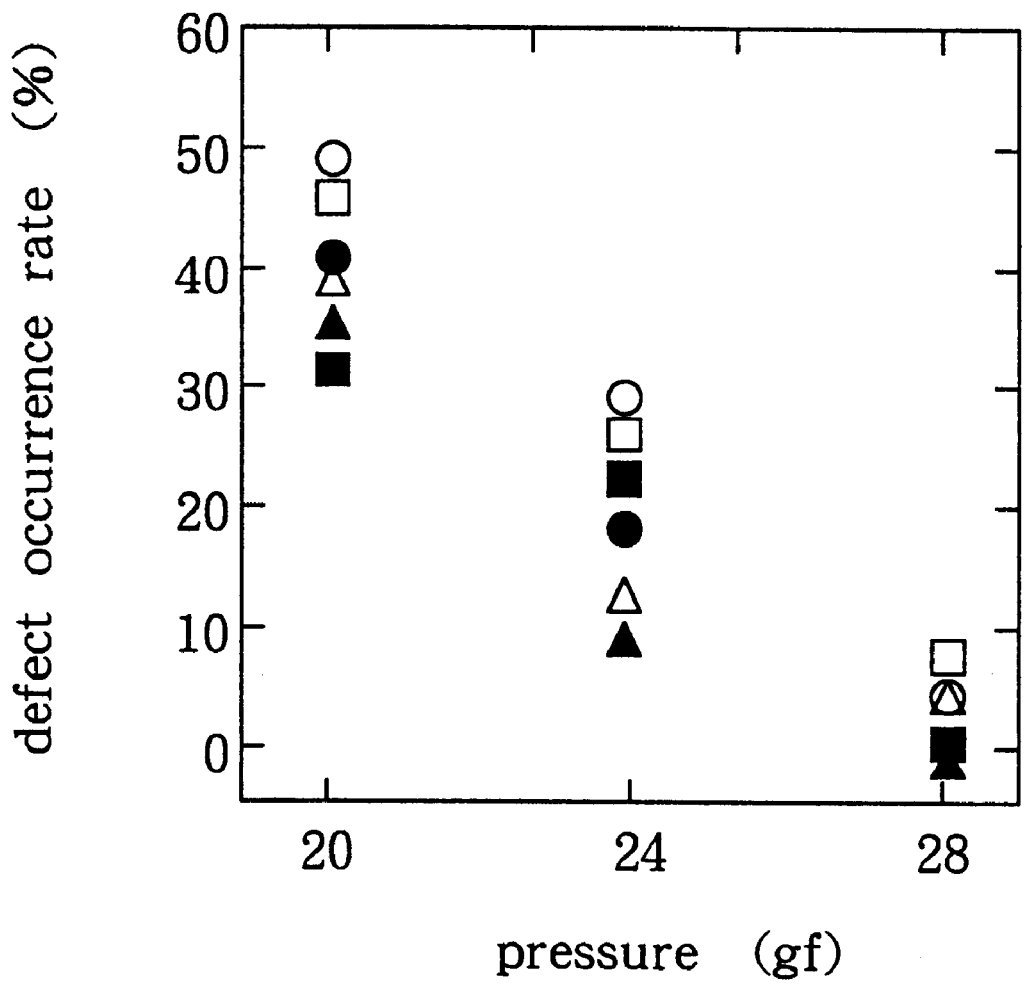
FIG. 12 shows a relation between pressure exerted at the time of bonding and generation rate (%) of defect such as breakage or crack of the connecting portion of the pad and the second insulating film of the conventional semiconductor device shown in FIG. 4.

FIG. 11 shows a relation between the defect occurrence rate and pressure applied to the pad during the bonding operation for the electrode structures shown in FIGS. 5 and 8 and FIG. 12 shows a relation between the defect occurrence rate and pressure applied to the pad during the bonding operation for the conventional electrode structure having pads each associated with one via-hole. In the respective electrode structures, the pads were formed of Al and the rates (%) of defect occurrence such as breakage and/or crack of the connecting portions between the pads and the insulating films underlying the pads were measured while changing the pressure applied during thethermosonic connection of the bonding wires to the pads from 20gf through 24gf to 28gf. The pads used were 4500Å thick, 6200Å thick and 7000Å thick. It is clear from FIGS. 11 and 12 that the defect occurrence rate of the electrode structure according to the present invention is substantially lower than that of the conventional electrode structure.

As described hereinbefore, according to the present invention, the region between the pad and the wiring is reinforced and it is possible to restrict occurrence of breakage and/or crack at the insulating film during the connecting operation of the bonding wire to the pad to thereby prevent the pad from being peeled off. Therefore, it is possible to improve the reliability of the connecting portion between the pad and the insulating film to thereby improve the fabrication yield of the semiconductor device.

What is claimed is:

1. An electrode structure of a semiconductor element comprising a wiring formed on one main surface of a semiconductor chip, an insulating film formed on said wiring, at least one pad located at a predetermined position on said insulating film and at least one via-hole formed in said insulating film, said at least one via-hole being filled with a metal material for electrically connecting said wiring to said at least one pad, wherein a contact area between at least one of said at least one via-hole and each of said at least one pad is 3% or more of a surface area of each said pad on the side of said at least one of said at least one via-hole.

2. An electrode structure as claimed in claim 1, wherein a plurality of via-holes are provided for each of said at least one pad.

3. An electrode structure of a semiconductor element comprising a wiring formed on one main surface of a semiconductor chip, an insulating film formed on said wiring, at least one pad located at a predetermined position on said insulating film and at least one via-hole formed in said insulating film, said at least one via-hole being filled with a metal material for electrically connecting said wiring to said at least one pad, wherein a contact area between at least one of said at least one via-hole and each of said at least one pad is 3% or more of a surface area of each said pad on the side of said at least one of said at least one via-hole, wherein 70,000 via holes or more are provided for 1 mm$^2$ of the surface area of each of said at least one pad.

* * * * *